United States Patent
Choi (10) Patent No.: US 9,158,396 B2
(45) Date of Patent: Oct. 13, 2015

(54) ORGANIC LIGHT EMITTING DIODE DISPLAY DEVICE WITH BUILT-IN TOUCH PANEL

(75) Inventor: Ho-Won Choi, Dae gu (KR)

(73) Assignee: LG DISPLAY CO., LTD., Seoul (KR)

( * ) Notice: Subject to any disclaimer, the term of this patent is extended or adjusted under 35 U.S.C. 154(b) by 456 days.

(21) Appl. No.: 13/168,282

(22) Filed: Jun. 24, 2011

(65) Prior Publication Data

US 2011/0316802 A1     Dec. 29, 2011

(30) Foreign Application Priority Data

Jun. 25, 2010   (KR) .................. 10-2010-0060308

(51) Int. Cl.
*G06F 3/041* (2006.01)
*G06F 3/044* (2006.01)
*H01L 27/32* (2006.01)

(52) U.S. Cl.
CPC ............... *G06F 3/041* (2013.01); *G06F 3/044* (2013.01); *H01L 27/323* (2013.01)

(58) Field of Classification Search
CPC ......... G09G 3/22; G09G 3/3208; G09G 3/30; G09G 3/3225; G09G 3/3233; G09G 3/3241; G09G 3/3266; G09G 3/3275; G09G 3/3258; H03K 17/962; H03K 17/955; H03K 17/9645; G01D 5/24
USPC .......................................... 345/156, 173–179
See application file for complete search history.

(56) References Cited

U.S. PATENT DOCUMENTS

| | | | |
|---|---|---|---|
| 6,654,449 B1 * | 11/2003 | Greene et al. ................... | 349/67 |
| 7,936,338 B2 * | 5/2011 | Iwase ............................ | 345/173 |
| 2002/0000979 A1 * | 1/2002 | Furuhashi et al. ............ | 345/173 |
| 2004/0080267 A1 * | 4/2004 | Cok ............................... | 313/512 |
| 2005/0056832 A1 * | 3/2005 | Yamazaki et al. ............. | 257/40 |
| 2005/0146516 A1 * | 7/2005 | Nishiyama .................... | 345/176 |
| 2007/0229479 A1 * | 10/2007 | Choo et al. .................... | 345/177 |
| 2007/0242055 A1 * | 10/2007 | Lai ................................. | 345/173 |
| 2008/0151171 A1 * | 6/2008 | Kim et al. ..................... | 349/150 |
| 2009/0109537 A1 * | 4/2009 | Bright et al. .................. | 359/588 |

(Continued)

FOREIGN PATENT DOCUMENTS

CN            101059738 A       10/2007

OTHER PUBLICATIONS

Office Action issued in corresponding Chinese Patent Application No. 201110180731.5, mailed May 13, 2013.

*Primary Examiner* — Kent Chang
*Assistant Examiner* — William Lu
(74) *Attorney, Agent, or Firm* — Brinks Gilson & Lione (57) ABSTRACT

An OLED display device has a built-in touch panel and includes an upper substrate and a lower substrate arranged opposite to each other, a thin film transistor array formed on the lower substrate, an organic light emitting array formed on the thin film transistor array, a touch sensor array formed on the upper substrate opposite to the lower substrate for sensing external touch by a capacitive type, an upper contact pad formed on the upper substrate to be connected to the touch sensor array, a lower contact pad formed on the lower substrate opposite to the plurality of upper contact pads, a conductive spacer connected between the upper contact pad and the lower contact pad, and a signal transmission film electrically connected to a main pad formed on the lower substrate and the lower contact pad for supplying signals for controlling the thin film transistor array and the touch sensor array.

20 Claims, 6 Drawing Sheets

(56) References Cited

U.S. PATENT DOCUMENTS

2010/0007616 A1* 1/2010 Jang .............................. 345/173
2010/0033443 A1* 2/2010 Hashimoto ................... 345/173
2010/0214247 A1* 8/2010 Tang et al. .................... 345/173
2010/0265187 A1* 10/2010 Chang et al. ................. 345/173
2010/0265207 A1* 10/2010 Chen ............................. 345/174

* cited by examiner

ORGANIC LIGHT EMITTING DIODE DISPLAY DEVICE WITH BUILT-IN TOUCH PANEL

This application claims the benefit of the Korean Patent Application No. 10-2010-0060308, filed in Korea on Jun. 25, 2010, which are hereby incorporated by reference as if fully set forth herein.

BACKGROUND

1. Field of the Invention

The present disclosure relates to organic light emitting diode OLED display devices, and more particularly to an OLED display device having a built-in touch panel for fabricating a slim OLED display device.

2. Discussion of the Related Art

The OLED display device is expected to be a next generation display device, which is a self emitting device with high brightness and a low driving voltage and enables fabrication of a super slim device.

Requirements for addition of a touch panel to the OLED display device are increasing for transmission of information thereto by touching a portion thereof with a hand or other additional input means.

In related art touch panels, there is an Add-On type touch panel, which is attached on an outside surface of the OLED display device, and an On-Cell type touch panel, which is deposited on the OLED display device.

Since the Add-On type touch panel has the touch panel mounted to an outside of the OLED display device, an adhesive layer is required between the touch panel and the OLED display device. In this case, an additional adhesion process is required, and it is difficult to separate the touch panel from the OLED display device if the touch panel and the OLED display device are bonded mismatched to each other. Even if the separation of the touch panel from the OLED display device is made, damage to the touch panel or the OLED display device is liable to take place. Moreover, an increased number of process steps for adhesion of the touch panel to the OLED display device is liable to increase a process time period and cost. And, by an amount the touch panel is attached to the OLED panel, the OLED display device becomes thicker to have a poor visibility.

The On-Cell type touch panel has an advantage in that the touch panel is formed as one unit with the OLED display device. However, because a touch electrode is formed on an upper substrate of the OLED display device, the On-Cell type touch panel has a problem in that defects caused by foreign matter or scratch can take place due to exposure of the touch electrode.

BRIEF SUMMARY

An OLED display device has a built-in touch panel and includes an upper substrate and a lower substrate arranged opposite to each other, a thin film transistor array formed on the lower substrate, an organic light emitting array formed on the thin film transistor array, a touch sensor array formed on the upper substrate opposite to the lower substrate for sensing external touch by a capacitive type, an upper contact pad formed on the upper substrate connected to the touch sensor array, a lower contact pad formed on the lower substrate opposite to the plurality of upper contact pads, a conductive spacer connected between the upper contact pad and the lower contact pad, and a signal transmission film electrically connected to a main pad formed on the lower substrate and the lower contact pad for supplying signals for controlling the thin film transistor array and the touch sensor array.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE DRAWINGS AND THE PRESENTLY PREFERRED EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
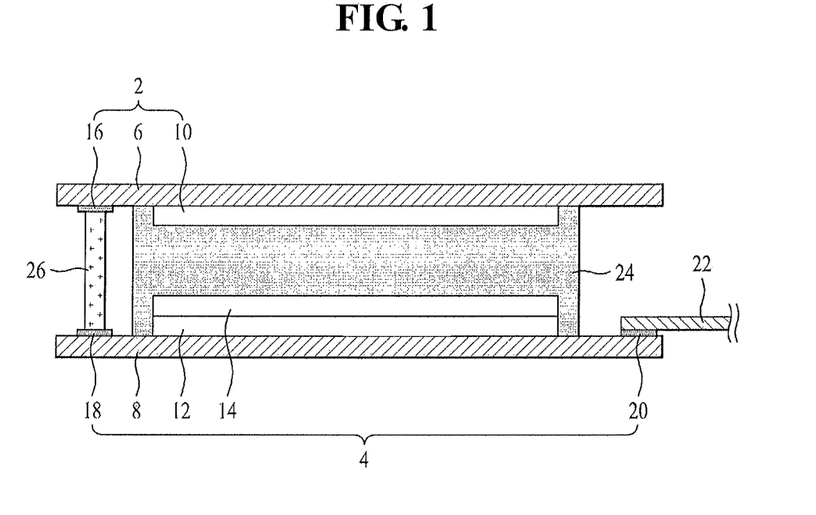
FIG. 1 illustrates a section of an OLED display device having a built-in touch panel in accordance with a preferred embodiment of the present invention, schematically.

FIG. 1 illustrates a section of an OLED display device having a built-in touch panel in accordance with a preferred embodiment of the present invention, schematically.

Referring to FIG. 1, the OLED display device having a built-in touch panel includes upper and lower arrays 2 and 4 arranged opposite to each other, and an FPC (Flexible Printed Circuit) 22 connected to the lower array 4.

The upper array 2 has a touch sensor array 10 formed on an upper substrate 6 and isolates the lower array 4 from an external environment.

The touch sensor array 10 of a capacitance type senses an external touch. Since the touch sensor array 10 is formed between the upper substrate 6 and the lower array 4 preventing an electrode which senses the touch from exposing to an outside, the defective touch caused by foreign matter or scratch can be prevented.

The lower array 4 has a thin film transistor TFT (Hereinafter TFT) array 12 and an OLED array 14 formed on the lower substrate 8.

The TFT array 12 has a plurality of gate lines (not shown) and a plurality of data lines (not shown) formed perpendicular to each other on the lower substrate 8 to define a light emitting region at each of crossed portions. Each of the light emitting regions has a TFT (not shown) for controlling a light emitting quantity from the OLED array 14. The TFT supplies an image signal from the data line to the OLED array 14 in response to a scan pulse from the gate line.

The OLED array 14 controls the light emitting quantity according to the image signal from the TFT. To do this, the OLED array 14 has a first electrode 40 connected to each of the TFTs, an organic light emitting layer 44 formed on a first electrode 40, a second electrode 46 formed on the organic light emitting layer 44, and a bank 42 which divides a plurality of light emitting regions (See FIG. 5).

In the meantime, the upper and lower arrays 2 and 4 are bonded face sealed with an adhesive film 24. The adhesive film 24 which is transparent bonds the upper and lower arrays 2 and 4 together as well as insulates the upper array 2 from the lower array 4 such that no electric interference takes place therebetween. Moreover, the adhesive film 24 maintains a gap between the upper and lower arrays 2 and 4 for preventing a touch malfunction from taking place, which is caused by an external pressure applied to the touch sensor array 10 to bring the touch sensor array 10 into contact with the lower array 4. And, since the adhesive film 24 seals the upper and lower arrays 2 and 4 by face sealing, prevention of infiltration of oxygen and water is easier than an outer sealing. The adhesive film 24 which is transparent becomes to have an adhesive force owing to an adhesive material, such as epoxy or silicone.

In the meantime, the upper array 2 has an upper contact pad 16 at one side outer region of the upper array 2 which is not sealed with the lower array 4 connected to the touch sensor array 10. For this, the upper array 2 has a first connection line 32 which connects the touch sensor array 10 to the upper contact pad 16. And, the lower array 4 has a lower contact pad 18 arranged opposite to the upper contact pad 16 and connected to the upper contact pad 16 through a conductive spacer 26. The lower contact pad 18 is connected to a main pad 20 formed on the other side outer region of the lower array 4 with a second connection line 38 (See FIG. 4) of the lower array 4. The main pad 20 is connected to the FPC 22 for transmission and reception of electric signals which control the touch sensor array 10 and the TFT array 12. According to this, the touch sensor array 10 is connected to the FPC 22 through the first connection line 32→upper contact pad 16→the conductive spacer 26→the lower contact pad 18→the second connection line 38→the main pad 20, electrically. In this instance, the conductive spacer 26 can be gold bonding, silver dot, sealant containing conductive balls, or a conductive film, preferably the silver dot which enables easy height adjustment. If the sealant containing conductive balls is used as the conductive spacer 26, securer bonding of the upper and lower arrays 2 and 4 can be made owing to the sealant which serves as a protective film or an adhesive.

The FPC 22 is connected to the lower array 4 through the main pad 20 formed on the lower array 4. The FPC 22 transmits an electric signal from a system control unit (not shown) to the lower array 4, and transmits a touch signal sensed at the touch sensor array 10 to the system control unit. The electric signal includes a signal supplied to the TFT array for controlling an output image, and a signal supplied to the touch sensor array 10 for driving the touch sensor array 10.

Thus, the OLED display device having a built-in touch panel in accordance with a preferred embodiment of the present invention has the touch sensor array 10 formed between the upper substrate 6 and the lower substrate 8. Therefore, different from the related art add-on type, since the touch panel is built-in an OLED display device, a slimmer device can be fabricated. And, different from the on-cell type, since the electrode that senses the touch is not exposed to an outside, defective touch caused by foreign matter or scratch can be prevented.

Moreover, since the FPC 22 performs functions of controlling the output image and transmission and reception of an electric signal required for driving the touch sensor, no additional FPC is required for driving the touch sensor, the an OLED display device of the present invention can have a simple structure and a lower production cost.

The face sealing of the upper and lower arrays 2 and 4 with the adhesive film 24 enables to maintain the gap between upper and lower arrays 2 and 4 easier than the case of outer sealing of the upper and lower arrays 2 and 4. Therefore, even if the upper array 2 has the external pressure applied thereto, the touch malfunction caused by the touch sensor array 10 brought into contact with the lower array 4 can be prevented. Moreover, since the adhesive film 24 serves as an insulator between the upper and lower arrays 2 and 4, the defective touch or a poor picture quality caused by electric interference between the touch sensor array 10 and the lower array 4 can be prevented.

Figure 2:
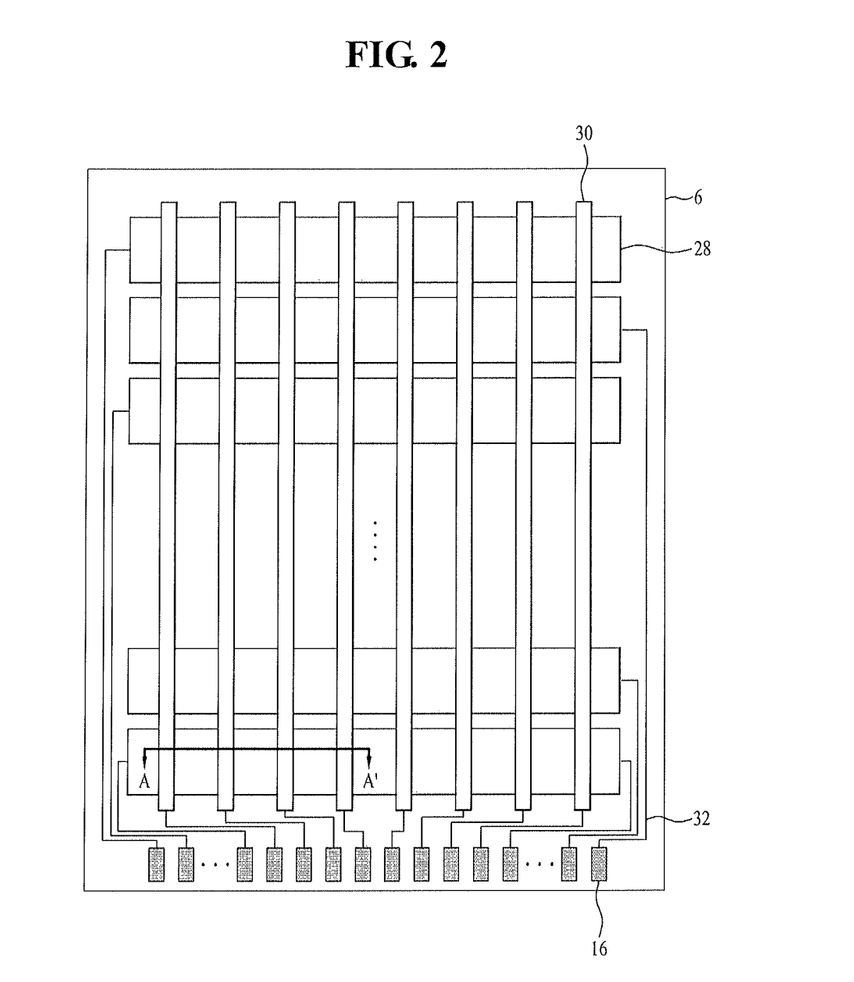
FIG. 2 illustrates a plan view of the upper array shown in FIG. 1.
Figure 3:
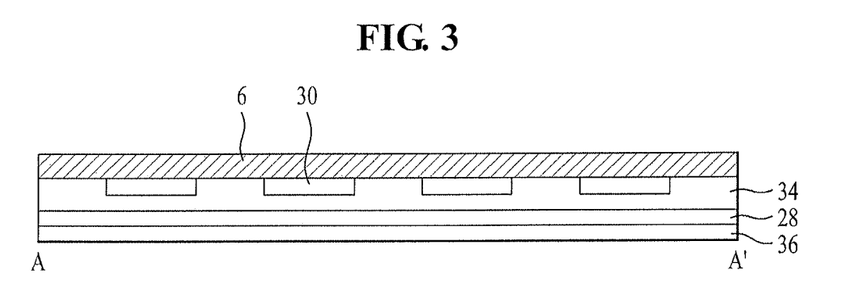
FIG. 3 illustrates a section of the upper array across a line A-A' in FIG. 2.

FIG. 2 illustrates a plan view of the upper array 2 shown in FIG. 1, and FIG. 3 illustrates a section of the upper array 2 across a line A-A' in FIG. 2.

Referring to FIGS. 2 and 3, the upper array 2 has the touch sensor array 10 on the upper substrate 6 for sensing external touch. The touch sensor array 10 includes a plurality of X electrodes 28 formed in one direction at fixed intervals, a first insulating film 34 formed on an entire surface of the upper substrate 6 including the X electrodes 28, Y electrodes 30 formed in a direction perpendicular to the X electrodes 28 on the first insulating film 34 at fixed intervals, and a second insulating film 36 formed on an entire surface of the first insulating film 34 including the Y electrodes 30.

One of the X and Y electrodes 28 and 30 functions as a driving electrode having a voltage applied thereto and the other one of the X and Y electrodes 28 and 30 functions as a sensing electrode which detects a voltage signal. Each of the X and Y electrodes 28 and 30 is connected to the upper contact pad 16 formed on one side of the upper substrate 6 with the first connection line 32 in one to one fashion. The upper contact pad 16 performs functions of voltage application and voltage detection. And, the upper contact pad 16 is formed opposite to the lower contact pad 18 at the time the upper and lower arrays 2 and 4 are bonded, and connected to the lower contact pad 18 with the conductive spacer 26.

The second insulating film 36 serves as an insulator between the X and Y electrodes 28 and 30 and the lower array 4 for preventing the defective touch or a poor picture quality from taking place due to electric interference between the X and Y electrodes 28 and 30 and the lower array 4.

The X electrodes 28 and Y electrodes 30 are transparent electrodes formed of any one selected from ITO (Indium Tin Oxide), IZO (Indium Zinc Oxide), and ITZO (Indium Tin Zinc Oxide). And, the first and second insulating films 34 and 36 are formed of a transparent organic insulating material.

In this instance, though the X electrodes 28 and Y electrodes 30 are shown to have bar shapes as an example, the shapes of the X electrodes 28 and Y electrodes 30 can vary as far as the X electrodes 28 and Y electrodes 30 are crossed, regularly.

Figure 4:
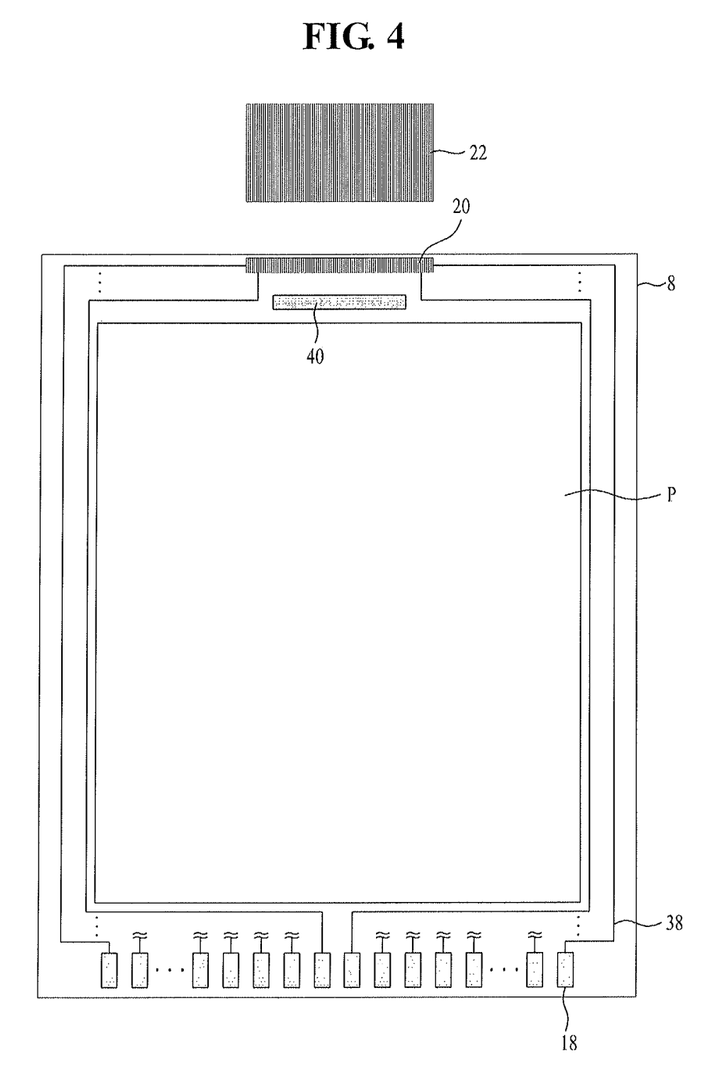
FIG. 4 illustrates a plan view of the lower array shown in FIG. 1.
Figure 5:
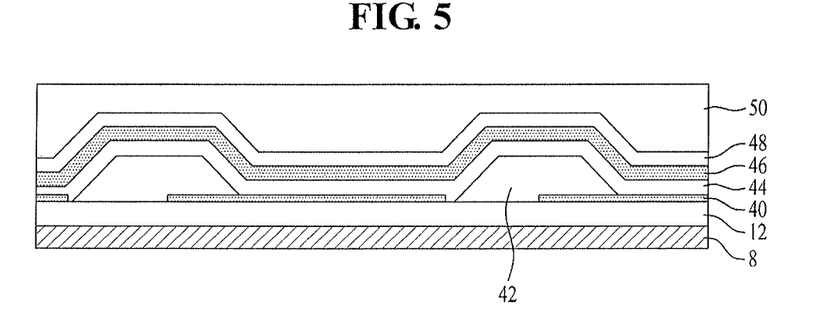
FIG. 5 illustrates a section of the lower array shown in FIG. 4.

FIG. 4 illustrates a plan view of the lower array 4 shown in FIG. 1, and FIG. 5 illustrates a section of the lower array 4 shown in FIG. 4.

Referring to FIGS. 4 and 5, the lower array 4 includes the TFT array 12 formed on the lower substrate 8, a first electrode 40 connected to the TFT array 12 for receiving the image signal, an organic light emitting layer 44 formed on the first electrodes 40, a second electrode 46 formed on the organic light emitting layer 44, a protective film 48 and a flattening film 50 formed on the second electrode 46 in succession, and a bank 42 which divides a plurality of light emitting regions P.

The TFT array 12 has a gate line and a data line formed on the lower substrate 8, a switching TFT (not shown), a driving TFT (not shown), and a capacitor (not shown).

The switching TFT supplies the image signal from the data line to the driving TFT in response to a scan pulse from the gate line. The driving TFT controls a quantity of a current flowing to the organic light emitting layer 44 through the first electrode 40 in response to the image signal. The capacitor makes a constant current to flow through the driving TFT even if the switching TFT is turned off.

The organic light emitting layer 44 emits a light as an exciter formed as a hole and an electron respectively injected thereto from the first electrode 40 and the second electrode 46 combine drops to a ground state. The organic light emitting layer 44 includes a hole injection layer HIL, a hole transporting layer HTL, an electron transporting layer ETL, and an electron injection layer EIL.

In the meantime, the lower array 4 includes a lower contact pad 18 formed on one side outer region, and a main pad 20 formed on the other side outer region connected to the FPC 22.

The lower contact pad 18 is formed opposite to the upper contact pad 16 at the time the upper and lower arrays 2 and 4 are bonded. And, each of the lower contact pads 18 is connected to the upper contact pads 16 with the conductive spacer 26 in one to one fashion. The lower contact pad 18 is connected to the main pad 20 with the second connection line 38.

The main pad 20 has a plurality of first to third pads connected to the FPC 22, electrically. The plurality of first pads apply a voltage signal to the X electrodes 28. The plurality of second pads detect a signal from the Y electrodes. The plurality of the third pads supply a plurality of control signals required for driving the TFT array 12. In this instance, the first and second pads are connected to the lower contact pad 18 with the second connection lines in one to one fashion.

In the meantime, the lower array 4 has an integrated circuit 40 for driving the TFT array 12. The integrated circuit 40 is mounted to the lower array 4 in a COG (Chip On Glass) type. The integrated circuit 40 drives the TFT array 12 according to a plurality of control signals from the plurality of the third pads.

The OLED display device having a built-in touch panel in accordance with a preferred embodiment of the present invention perceives a touch as follows.

Upon application of a voltage to the X electrodes 28 in succession, a change of capacitance takes place between the X electrodes 28 and the Y electrodes 30 depending on whether the touch is made or not. The change of the capacitance changes a current from the Y electrodes 30. By sensing the current change from the Y electrodes 30, a touched portion is perceived.

In this instance, since the successive voltage application to the X electrodes 28 and the successive current detection by the Y electrodes 30 are made within one frame, when the touch takes place at a plurality of places simultaneously, sensing of a plurality of touches can be possible.

Figure 6:
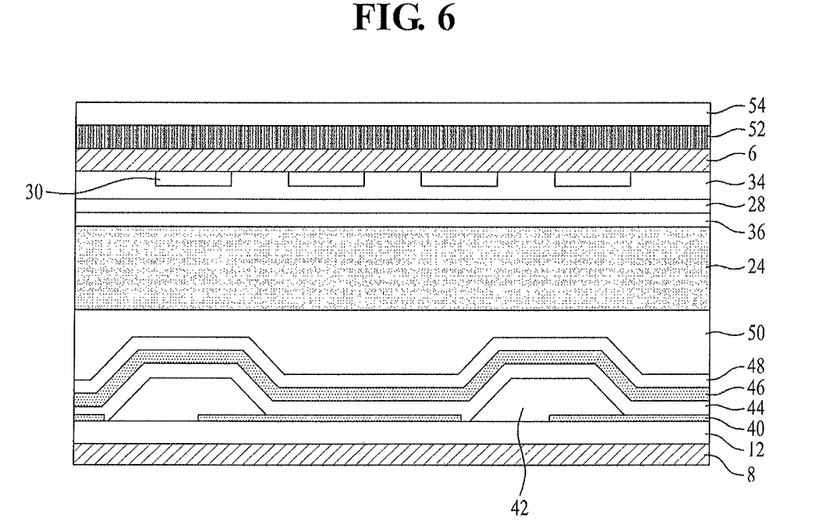
FIG. 6 illustrates a section of an OLED display device having a built-in touch panel in accordance with a preferred embodiment of the present invention.

In the meantime, referring to FIG. 6, the OLED display device having a built-in touch panel includes a polarizing plate 52 for increasing an angular field of view of the image to be displayed on a rear side of the upper substrate 6, and a cover glass 54 for protecting the OLED device against an external impact, additionally.

Interference between electric signals flowing to the upper and lower arrays 2 and 4 causes defective touch or a poor picture quality. In order to prevent this from taking place, in the embodiment of the present invention, the upper and lower arrays 2 and 4 are face sealed with the adhesive film 24 which is formed of an insulating material for preventing the upper and lower arrays 2 and 4 from interfering with each other, electrically.

The electric interference between the upper and lower arrays 2 and 4 is influenced by the gap between the upper and lower arrays 2 and 4. That is, if the gap between the upper and lower arrays 2 and 4 is close excessively, making the electric interference between the upper and lower arrays 2 and 4 greater, the defective touch or the poor picture quality takes place. Therefore, it is required to maintain the gap between the upper and lower arrays 2 and 4 to be greater than a predetermined value. For this, the adhesive film is made to have a thickness of 5~100 μm to maintain the gap between the upper and lower arrays 2 and 4 to be 5~100 μm. According to this, the electric interference between the upper and lower arrays 2 and 4 can be prevented, additionally. In this instance, even though it is described that the adhesive film has a thickness of about 5~about 100 μm, the thickness of the adhesive film can be adjusted as far as the gap is enough to prevent the electric interference between the upper and lower arrays 2 and 4 from taking place.

Figure 7:
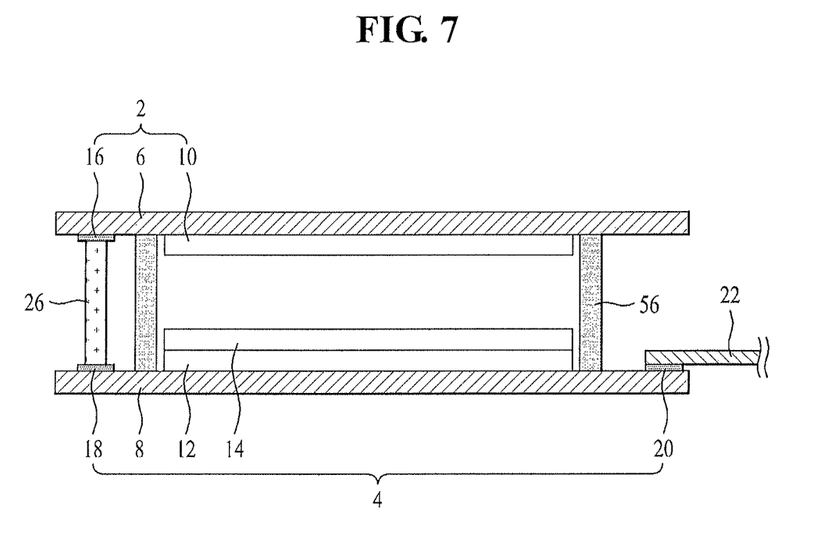
FIG. 7 illustrates a section of an OLED display device having a built-in touch panel in accordance with another preferred embodiment of the present invention, schematically.

Even though the embodiment of the present invention has applied the face sealing to make maintaining the about 5~about 100 μm gap between the upper and lower arrays 2 and 4 is favorable, as shown in FIG. 7, only an outer portion can also be sealed with a sealing material 56 of Frit or Epoxy. In this instance, it is preferable that the gap between the upper and lower arrays 2 and 4 is about 5~about 100 μm for preventing the electric interference from taking place.

And, as the gap between the upper and lower arrays 2 and 4 is maintained to be about 5~about 100 μm, it is preferable that a height of the conductive spacer 26 which connects the upper contact pad 16 to the lower contact pad 18 is also about 5~about 100 μm As has been described, the OLED display device having a built-in touch panel of the present invention has the following advantages.

The OLED display device having a built-in touch panel of the present invention forms the touch sensor array 10 between the upper substrate 6 and the lower substrate 8. Accordingly, different from the related art add-on type, since the touch panel is built-in, a slimmer device can be fabricated. And, different from the on-cell type, since the electrode for sensing the touch is not exposed to an outside, defective touch caused by foreign matter or scratch can be prevented.

Moreover, since the output image control and the transmission and reception of electric signals required for driving the touch sensor are performed by one FPC 22, requiring no additional FPC, the OLED display device having a built-in touch panel of the present invention becomes to have a simple structure and a low production cost.

Since the upper and lower arrays 2 and 4 are face sealed with the adhesive film 24, the maintenance of the gap between the upper and lower arrays 2 and 4 becomes easier than a case when the upper and lower arrays 2 and 4 are sealed at an outer side thereof. Accordingly, even if the upper array 2 has the external pressure applied thereto, the touch malfunction caused by the touch sensor array 10 brought into contact with the lower array 4 can be prevented. Moreover, since a predetermined gap between the upper and lower arrays 2 and 4 can be maintained, the electric interference between the upper and lower arrays 2 and 4 can be prevented. And, since the adhesive film 24 serves as an insulator between the upper and lower arrays 2 and 4, the electric interference between the upper and lower arrays 2 and 4 can be prevented, additionally.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. An OLED display device having a built-in touch panel comprising:
    an upper substrate and a lower substrate arranged opposite to each other;
    a thin film transistor array on the lower substrate;
    an organic light emitting array on the thin film transistor array;
    a flattening film formed on the organic light emitting array;
    a touch sensor array on the upper substrate opposite to the lower substrate for sensing external touch by a capacitive type;
    an adhesive film formed between the organic light emitting array and the touch sensor array;
    an upper contact pad formed on an outer region of the upper substrate and connected to the touch sensor array;
    a lower contact pad formed on an outer region of the lower substrate opposite to the upper contact pad;
    a conductive spacer connected between the upper contact pad and the lower contact pad; and
    a signal transmission film electrically connected to a main pad on the lower substrate and supplying signals that control the thin film transistor array and the touch sensor array,
    wherein the lower contact pad is on one side of the outer region of the lower substrate, and the main pad is on another side of the outer region of the lower substrate and electrically connected to the lower contact pad with a connection line which is formed on the lower substrate,
    wherein the touch sensor array includes a plurality of X electrodes, a first insulating film formed on the X electrodes, a plurality of Y electrodes formed on the first insulating film, and a second insulating film formed on the Y electrodes,
    wherein a top surface of the flattening film and a top surface of the second insulating film are flat and opposite to each other,
    wherein a space between the flattening film and the second insulating film is filled with the adhesive film, so that the flattening film and the second insulating film are directly face sealed by the adhesive film, and
    wherein the adhesive film is formed of an insulating material and covers at least the flattening film and side surfaces of the organic light emitting array.

2. The device as claimed in claim 1, wherein the organic light emitting array comprises:
    a first electrode formed on the thin film transistor array and connected to the thin film transistor array for receiving the image signal;
    a bank formed on the thin film transistor array and covers at least a part of a boundary of the first electrode and dividing a plurality of light emitting regions;
    an organic light emitting layer formed on the first electrode and the bank; and
    a second electrode formed on the organic light emitting layer,
    wherein the second electrode is covered by a protective film and the flattening film is formed on the protective film.

3. The device as claimed in claim 1, wherein the adhesive film comprises a transparent film and has an adhesive force owing to an adhesive material.

4. The device as claimed in claim 1, wherein the adhesive film has a thickness of about 5~about 100 μm.

5. The device as claimed in claim 1, wherein the conductive spacer comprises a silver dot.

6. The device as claimed in claim 3, further comprising:
    a polarizing plate for increasing an angular field of view of the image to be displayed, and
    a cover glass for protecting the OLED device against an external impact,
    wherein both the polarizing plate and the cover glass are positioned above the upper substrate.

7. The device as claimed in claim 1, wherein the main pad has a plurality of first to third pads electrically connected to the signal transmission film,
    the plurality of first pads apply a voltage signal to the X electrodes,
    the plurality of second pads detect a signal from the Y electrodes,
    the plurality of the third pads supply a plurality of control signals required for driving the thin film transistor array, and
    the first and second pads are connected to the lower contact pad with the connection lines in one to one fashion.

8. The device as claimed in claim 7, further comprising an integrated circuit for driving the thin film transistor array,
    wherein the integrated circuit is mounted to the lower substrate and drives the thin film transistor array according to the plurality of control signals supplied from the plurality of the third pads.

9. The device as claimed in claim 1, wherein the adhesive film comprises one of an epoxy material or a silicone material.

10. The device as claimed in claim 1, wherein the conductive spacer comprises a sealant containing conductive balls.

11. An OLED display device having a built-in touch panel comprising:
    an upper substrate and a lower substrate arranged opposite to each other;
    a thin film transistor array on the lower substrate;
    an organic light emitting array on the thin film transistor array;
    a touch sensor array on the upper substrate opposite to the lower substrate for sensing external touch by a capacitive type; and
    an adhesive film formed between the organic light emitting array and the touch sensor array,
    wherein a space between the organic light emitting array and the touch sensor array is filled with the adhesive film, so that the upper substrate and the lower substrate are face sealed by the adhesive film, and
    wherein the adhesive film is formed of an insulating material and covers side surfaces of at least the organic light emitting array.

12. The device as claimed in claim 11, further comprising an upper contact pad formed on an outer region of the upper substrate and connected to the touch sensor array.

13. The device as claimed in claim 12, further comprising a lower contact pad formed on an outer region of the lower substrate opposite to upper contact pad.

14. The device as claimed in claim 13, further comprising a conductive spacer connected between the upper contact pad and the lower contact pad.

15. The device as claimed in claim 14, further comprising a signal transmission film electrically connected to a main pad on the lower substrate and supplying signals used to control the thin film transistor array and the touch sensor array.

16. The device as claimed in claim 15,
   wherein the lower contact pad is on one side of the outer region of the lower substrate, and
   the main pad is on another side of the outer region of the lower substrate and electrically connected to the lower contact pad with a connection line which is formed on the lower substrate.

17. An apparatus comprising:
   first and second substrates;
   a thin film transistor array formed on an inner surface of the first substrate;
   an organic light emitting array formed on the thin film transistor array;
   a built-in type touch sensor array formed on an inner surface of the second substrate and having capacitive type touch sensing capabilities; and
   a face seal between the first and second substrates for bonding between the first and second substrates in a face sealed manner,
   wherein the face seal is formed of an adhesive material having properties of transparency and insulating,
   wherein a space between the organic light emitting array and the built-in type touch sensor array is filled with the face seal, so that a gap distance between the organic light emitting array and the built-in type touch sensor array is maintained in 5 to 100 μm,
   wherein the face seal covers sides of at least the organic light emitting array so that infiltration of oxygen or moisture to the organic light emitting array is minimized.

18. The apparatus of claim 17, wherein the built-in type touch sensor array comprises driving electrodes and sensing electrodes which are made of an indium oxide based material that exhibits transparency.

19. The apparatus of claim 18, further comprising:
   a first contact pad on an outer region of the second substrate and connected to the built-in type touch sensor array,
   a second contact pad on an outer region of the first substrate opposite to the first contact pad, and
   a conductive spacer connected between the first contact pad and the second contact pad.

20. The apparatus of claim 19, further comprising:
   a Flexible Printed Circuit(FPC) electrically connected to a main pad on the lower substrate and supplying signals that control the thin film transistor array and the touch sensor array,
   wherein the main pad is electrically connected to the second contact pad with a connection line which is formed on the lower substrate.

* * * * *